United States Patent [19]

Hwang et al.

[11] Patent Number: 5,620,912
[45] Date of Patent: Apr. 15, 1997

[54] METHOD OF MANUFACTURING A SEMICONDUCTOR DEVICE USING A SPACER

[75] Inventors: Lee Y. Hwang, Cheongju-si; Hong S. Kim, Daejeon-si, both of Rep. of Korea

[73] Assignee: LG Semicon Co., Ltd., Chungcheongbuk-do, Rep. of Korea

[21] Appl. No.: 462,042

[22] Filed: Jun. 5, 1995

[30] Foreign Application Priority Data

Jul. 21, 1994 [KR] Rep. of Korea ............... 17683/1994

[51] Int. Cl.⁶ ........................................ H01L 21/8234
[52] U.S. Cl. .................. 438/301; 438/303; 438/556; 438/586
[58] Field of Search ................. 437/415 SW, 41 R, 437/162, 913, 203, 157, 158, 40 R, 40 SW, 241; 148/DIG. 44, DIG. 31

[56] References Cited

U.S. PATENT DOCUMENTS

| | | | |
|---|---|---|---|
| 4,963,502 | 10/1990 | Teng et al. | 437/162 |
| 5,017,998 | 5/1991 | Miura et al. | 257/347 |
| 5,040,037 | 8/1991 | Yamaguchi et al. | 257/347 |
| 5,116,768 | 5/1992 | Kawamura | 437/21 |
| 5,188,973 | 2/1993 | Omura et al. | 437/21 |
| 5,191,397 | 3/1993 | Yoshida | 257/347 |

FOREIGN PATENT DOCUMENTS 1187870  7/1989  Japan ................... 437/913

OTHER PUBLICATIONS

Wolf et al., "Silicon Processing for the VLSI", pp. 529–532, 1986, vol. 1.

*Primary Examiner*—Michael Trinh
*Attorney, Agent, or Firm*—Morgan, Lewis and Bockius LLP

[57] ABSTRACT

A semiconductor device and manufacturing method wherein a gate insulating film is formed on a semiconductor substrate. A gate is formed on the gate insulating film and a sidewall spacer is formed on respective sides of the gate. The substrate is etched at the respective sides of the gate to form respective recessed parts of the substrate. An insulating film is provided on the recessed parts of the substrate and the recessed parts are filled with a semiconductor layer. Impurity regions are formed contacting the semiconductor layer in the semiconductor substrate on the respective sides of the gate.

14 Claims, 4 Drawing Sheets

5,620,912

METHOD OF MANUFACTURING A SEMICONDUCTOR DEVICE USING A SPACER

BACKGROUND OF THE INVENTION

1. Field of the Invention

The present invention relates to a semiconductor device, and more particularly, to a metal oxide semiconductor (MOS) transistor having high-breakdown voltage and high-speed characteristics.

2. Discussion of the Related Art

The most general type of metal oxide semiconductor field effect transistor (MOSFET) includes a gate electrode 13 formed on a semiconductor substrate 11 with a gate insulating film 12 interposed therebetween, as shown in FIG. 1. Source region 14 and drain region 15 are impurity diffusion regions formed at respective sides of the gate electrode 13 in the substrate 11. Due to a large junction capacitance between source/drain regions 14 and 15 and a bulk silicon, i.e., substrate 11, the abovementioned MOSFET is unsuitable for a semiconductor device requiring high-speed operations.

When the above MOSFET is applied to a highly integrated semiconductor device, isolation and latch up characteristics become poor. Moreover, the source/drain regions 14 and 15 are formed in the substrate 11 by implanting impurity ions using an ion-implantation technique. To operate the above MOSFET under a high voltage, a complicated insulation structure must be formed around the source/drain regions 14 and 15. Accordingly, the above MOSFET cannot be applied to a highly integrated circuit requiring a high voltage.

A MOSFET having a silicon on an insulator (SOI) structure has been proposed as a device favorable to higher integration. In this device, power consumed is low and a high voltage operation can be realized without latch up and soft error.

In the above MOSFET having the SOI structure, as shown in FIG. 2, an insulating layer 22 is formed on a substrate 21. A polycrystalline silicon layer 23 is formed on insulating layer 22 as a semiconductor layer. A gate insulating film 24 and a gate electrode 25 are formed sequentially thereon. Source/drain regions 26 and 27 are formed at respective sides of gate electrode 26 in silicon layer 23.

A high breakdown voltage can be obtained in the above MOSFET, and thereby used in a highly integrated circuit at high voltage. However, if the insulating film underneath the semiconductor layer having the SOI structure is formed very thick, a drain electric field affects the electric field distribution of the semiconductor layer, thereby increasing a short-channel effect. If the insulating film is formed thin, the short-channel effect can be suppressed. However, the decrease in thickness of the insulating film causes an increase in parasitic capacitance, and hence, high-speed characteristics cannot be obtained.

SUMMARY OF THE INVENTION

The present invention has been made in view of the above circumstances and has an object of overcoming the problems and disadvantages of the prior art.

A further object of the present invention is to provide a method of manufacturing a transistor where the junction leakage current and junction capacitance are decreased between the impurity diffusion region and a bulk silicon.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the invention, as embodied and broadly described, a method of manufacturing a MOS transistor of the present invention comprises the steps of forming a gate insulating film on a semiconductor substrate; forming a gate on the gate insulating film; forming a spacer on respective sides of the gate; etching the substrate at the respective sides of the gate to form respective recessed parts of the substrate; providing an insulating film on bottom portions of the recessed parts of the substrate; filling the recessed parts with a semiconductor layer; and forming impurity regions in the semiconductor substrate on the respective sides of the gate, the impurity regions contacting the semiconductor layer.

In another aspect, the present invention is a semiconductor device comprising a semiconductor substrate; a gate insulating film disposed on the semiconductor substrate; a gate electrode disposed on the gate insulating film; a spacer disposed on respective sides of the gate; recessed parts disposed in the substrate at respective sides of the gate; an insulating film disposed on the recessed parts; a semiconductor layer formed in the recessed parts; and impurity regions in the semiconductor substrate on the respective sides of the gate, the impurity regions contacting the semiconductor layer.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Reference will now be made in detail to the present preferred embodiments of the invention, examples of which are illustrated in the accompanying drawings.

Figure 3:
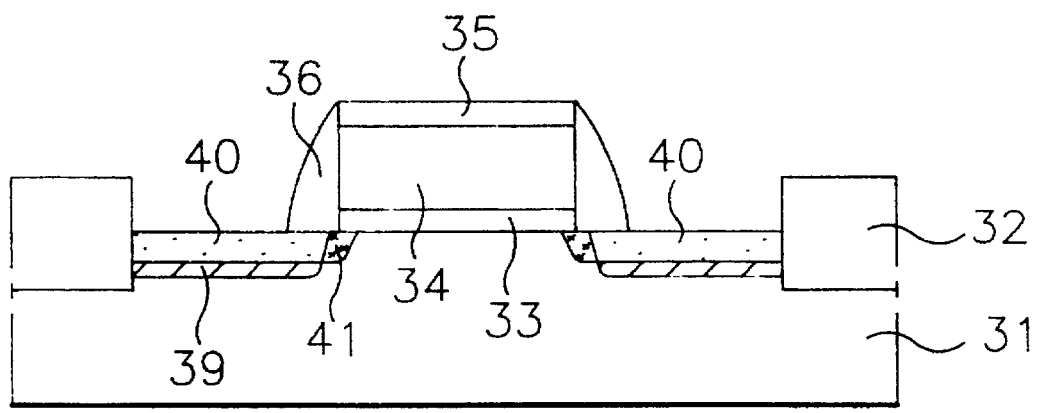
FIG. 3 is a cross-sectional view of a MOSFET according to an embodiment of the present invention.

FIG. 3 shows a cross-sectional structure of a MOSFET according to an embodiment of the present invention. In the MOSFET according to the present embodiment, a semiconductor substrate 31 is divided into a flat part and a recessed part on both sides of the flat part. On the flat part of semiconductor substrate 31, a field oxide film 32, and gate insulating film 33 are formed. The recessed part of semiconductor substrate 31 is filled with a semiconductor layer 40 having a doped polysilicon film. In semiconductor substrate 31, an insulating film 39 having an oxide film is formed below semiconductor layer 40, and simultaneously, an impurity region 41 of a high concentration is formed which contacts a side of semiconductor layer 40. The semiconductor layer 40 and impurity region 41 serve as source/drain regions of the MOSFET. Moreover, the MOSFET of the present invention further includes a sidewall spacer 36 formed on semiconductor layer 40 and impurity regions 41 located on respective sides of gate insulating film 33, a cap insulating film 35 formed on gate 34, and a field oxide film 32 defining an active region.

Referring to FIG. 3, semiconductor layer 40, which serves as source/drain regions, is protected by insulating film 39, thereby improving the insulation and latch up characteristics. In addition, the junction capacitance can be decreased.

In the MOSFET of the present invention, the bottom of impurity region 41, which serves as source/drain regions, is surrounded by insulating film 39 consisting of an oxide film. Therefore, a field ion-implantation region for insulating elements formed below the field oxide film from one another, as in the conventional MOSFET, is unnecessary.

When the present invention is applied to a highly integrated semiconductor memory device comprising a MOSFET and capacitor, a minimum capacitance ($C_S$) can be secured to distinguish the state of data at the storage node of the capacitor. More specifically, as the integration of the semiconductor memory device increases, the area occupied by the capacitor is decreased, resulting in a lower capacitance of the capacitor.

In order to accurately distinguish the state (0 or 1) of data given in a bitline, the ratio $C_B/C_S$ of bitline capacitance $C_B$ with respect to capacitance $C_S$ of the capacitor storage node should be low. However, for a conventional, highly integrated memory device, the capacitor area decreases with higher integration, as described above, which makes it impossible to secure a minimum capacitance to determine the state of data. Attempts have been made to secure such a minimum capacitance.

However, increasing the capacitance $C_S$ of the capacitor storage node is limited within the restricted capacitor area. Hence, a method of decreasing the bitline capacitance $C_B$ is considered instead of increasing the capacitance $C_S$ of the capacitor storage node.

Elements constituting the bitline capacitance $C_B$ include a coupling capacitance between the bitlines, a capacitance between one of the bitlines and a capacitor plate electrode, a capacitance between one of the bitlines and a metal interconnection layer, and a bitline junction capacitance. In the present invention, since the bitline junction capacitance occupies about 50% of the bitline capacitance, reducing the bitline junction capacitance decreases the entire bitline capacitance $C_S$, resulting in a lower value of $C_B/C_S$. Moreover, a very low junction capacitance between the source/drain regions and silicon substrate in the present invention decreases the junction capacitance of the bitline connected to the drain, providing a lower value of $C_B/C_S$, as described above.

Accordingly, due to the reduced value of $C_B/C_S$, as above, when the MOSFET of the present invention is applied to a memory cell, the advantages of higher integration is possible.

A method of manufacturing an MOSFET according to the embodiment of the present invention having the aforementioned structure will be described below with reference to FIGS. 4a through 4i.

Figure 4A:
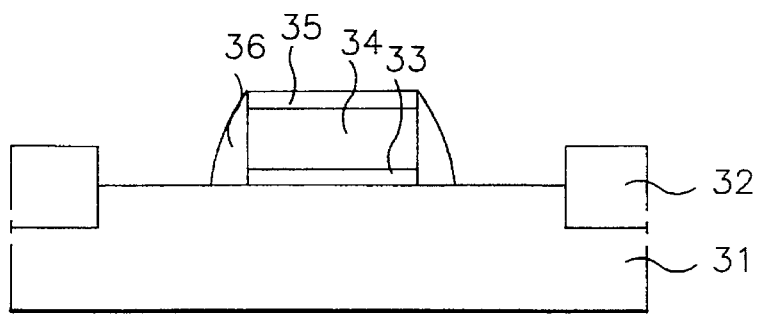
FIGS. 4a through 4i are cross-sectional views illustrating a method of manufacturing a MOSFET according to the embodiment of the present invention.

Referring to FIG. 4a, a field oxide film 32 for defining an active region is formed on a semiconductor substrate 31. Then, a gate insulating film 33, gate 34, and gate cap oxide film 35 are sequentially formed on the active region of the semiconductor substrate. An insulating film is formed on the entire surface of the substrate and etched back, thereby forming a sidewall spacer 36 on the semiconductor substrate on the side of the gate.

Here, field oxide film 32 is used for isolating elements from one another. In the present invention, the field oxide film is preferably formed in a box structure using a trench, as shown in FIG. 4a.

Figure 4B:
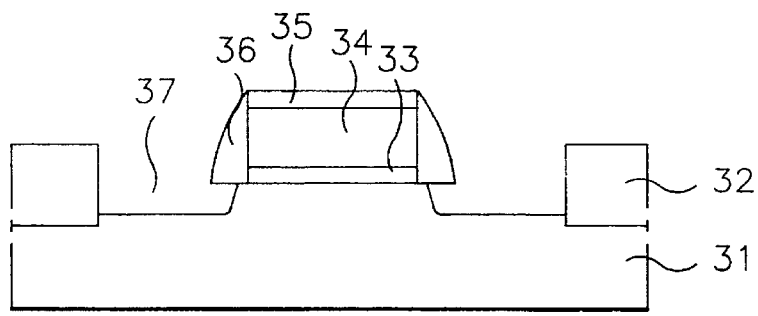

The exposed portion of substrate 31 is isotropically etched using sidewall spacer 36 and field oxide film 32 as masks. The above isotropic etching is performed until the substrate underneath sidewall spacer 36 is undercutted, thereby forming a recess part 37, as shown in FIG. 4b.

Figure 4C:
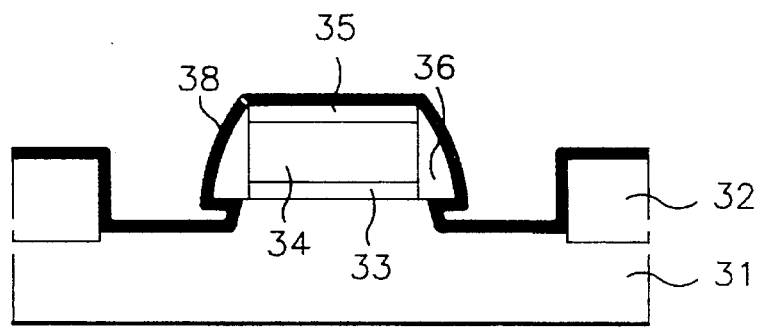
Figure 4D:
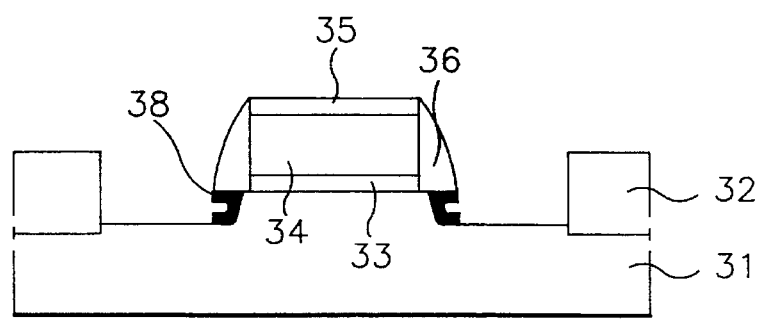

As shown in FIG. 4c, a nitride film 38 is formed on the entire surface of the substrate as an oxidation-blocking film. Then, as shown in FIG. 4d, nitride film 38 is anisotropically etched through a reactive ion etching (RIE) method. As a result, nitride film 38 remains only on the recess part 37 underneath sidewall spacer 36.

Figure 4E:
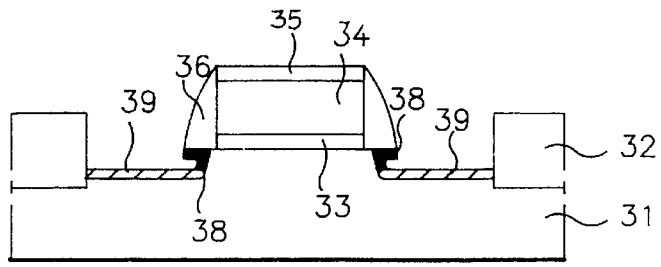
Figure 4F:
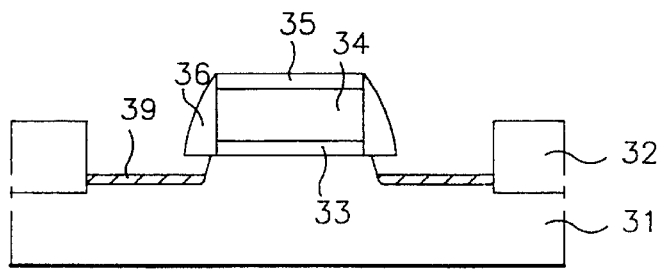

As shown in FIG. 4e, an oxidation process is performed, thereby forming an oxide film 39 on recess part 37 of the substrate formed in the process of FIG. 4d, as an insulating film. During the oxidation process, nitride film 38 located below spacer 37 serves as an oxidation-blocking film, so that oxide film 39 is formed only on the bottom of recess part 37. After forming the oxide film through the oxidation process, as shown in FIG. 4f, nitride film 38 left below the sidewall spacer is removed.

Figure 4G:
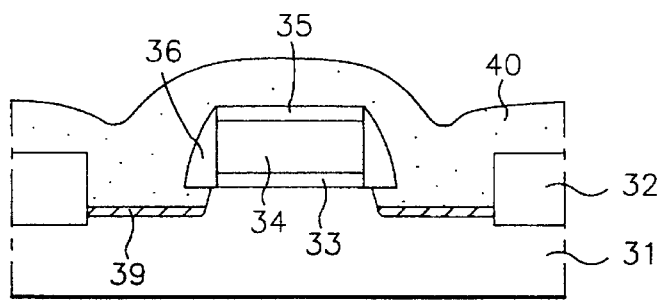
Figure 4H:
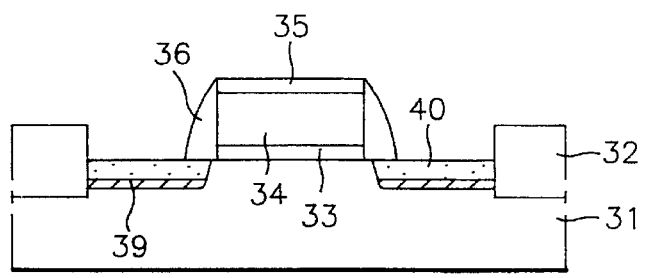

As shown in FIG. 4g, a polysilicon film 40 is formed on the entire surface of the substrate. Then, as shown in FIG. 4h, polysilicon film 40 is etched back, thereby filling recess part 37 with polysilicon film 40. Here, polysilicon film 40 is a doped polysilicon film formed by coating an undoped polysilicon film and then doping the polysilicon film with impurities. Alternatively, polysilicon film 40 may be formed by directly forming a doped polysilicon film.

Figure 4I:
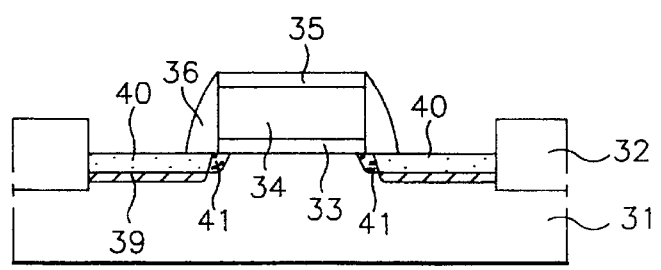

Thereafter, a drive-in process is performed by a heat treatment, so that the substrate is automatically doped with impurities in polysilicon film 40 located below sidewall spacer 36. Thus, impurity regions 41 serving as source/drain regions are formed below sidewall spacer 36, as shown in FIG. 4i. At this time, oxide film 39 serves as an isolation structure as well as a diffusion-blocking film.

The MOSFET of the present invention, as described above, provides the following advantages over conventional devices. First, in the MOSFET of the present invention, a semiconductor layer serving as source/drain regions is protected by an oxide film, resulting in an improved isolation characteristics of the device. Therefore, the present invention is advantageous at higher integration. Further, since the junction leakage of the source/drain regions can be extremely minimized, the junction breakdown voltage can be improved. Thus, the present invention can be usefully applied to a device requiring a high breakdown voltage. In addition, due to an oxide film surrounding the source/drain regions, latch-up characteristics of the device can be improved, and simultaneously, resistance against soft-error can be improved as well.

Second, since an oxide film surrounding the bottom of the source/drain regions is formed in the present invention, no additional field ion-implantation process of forming a field ion-implantation region below a field oxide film is needed for insulating elements from one another. Therefore, the method according to the present invention is simpler than the conventional method.

Third, since the junction capacitance between the source/drain regions and the bulk substrate is smaller in the MOSFET of the present invention than in the conventional MOSFET, the present invention can be applied to a device requiring a high speed operation. Further, it is possible to form the source/drain regions having a shallow junction through an auto-doping method using a doped polysilicon film to improve punch-through characteristics of the device.

Figure 1:
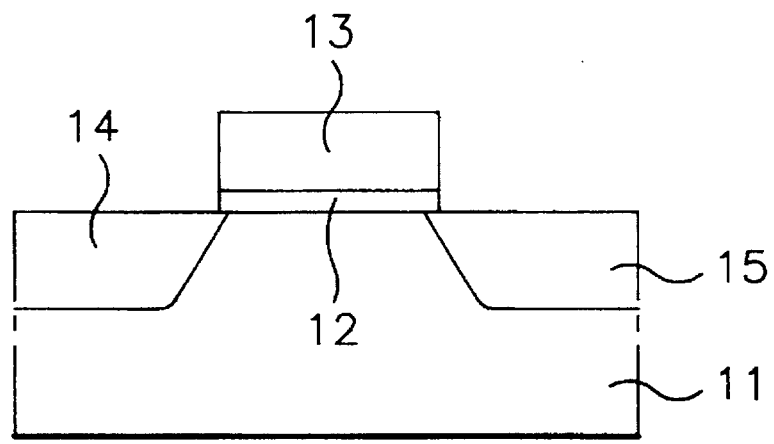
FIG. 1 is a cross-sectional view of a conventional MOSFET.
Figure 2:
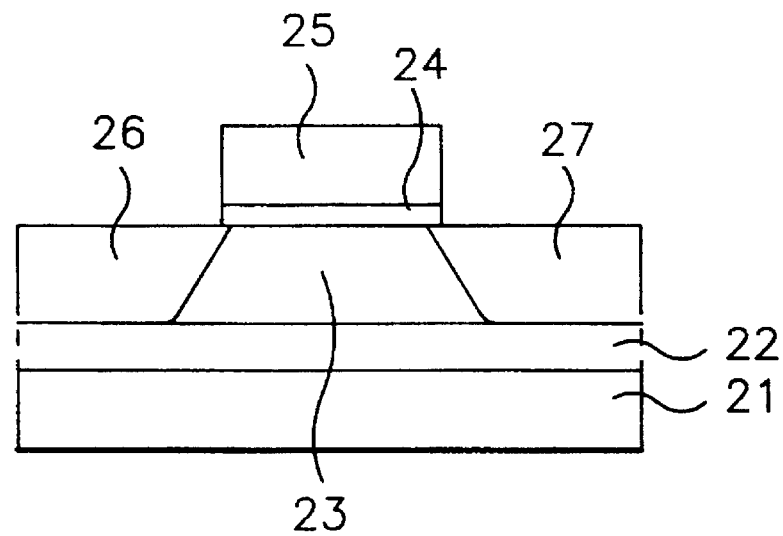
FIG. 2 is a cross-sectional view of a MOSFET having a conventional SOI structure.

Fourth, due to the improved characteristics as described above, the MOSFET of the present invention can replace the MOSFET having a conventional SOI structure of FIG. 2. In the MOSFET having the conventional SOI structure of FIG. 2, an insulating film is formed below the entire surface of a semiconductor layer. On the other hand, the MOSFET of the present invention has a structure in which an insulating film made of an oxide film is formed only below the source/drain regions. Thus, a floating body effect caused by the conventional SOI structure can be minimized.

Fifth, when the MOSFET of the present invention, having a very low junction capacitance, is applied to a semiconductor memory device comprising an MOSFET and a capacitor, capacitance $C_B$ of a bitline formed on the drain region is decreased. Thus, the value of $C_B/C_S$ is decreased, resulting in a reduced area of the memory cell. Accordingly, the MOSFET of the present invention has a very low junction capacitance and can be applied effectively to a highly integrated semiconductor memory device.

Accordingly, in the present invention, an oxide film is used to protect an impurity diffusion region excluding a channel region and thus decreasing the junction leakage current and junction capacitance between the impurity diffusion region and a bulk silicon.

The foregoing description of preferred embodiments of the invention has been presented for purposes of illustration and description. It is not intended to be exhaustive or to limit the invention to the precise form disclosed. Thus, modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device, comprising the steps of:

forming a gate insulating film on a semiconductor substrate;

forming a gate on the gate insulating film;

forming a spacer on respective sides of the gate;

etching the substrate at the respective sides of the gate to form respective recessed parts of the substrate so that the recessed parts extend underneath the spacer;

providing an insulating film on the recessed parts underneath the spacer;

depositing a semiconductor layer on the insulating film extending underneath the spacer to fill the recessed parts; and forming impurity regions in the semiconductor substrate on the respective sides of the gate, the impurity regions contacting the semiconductor layer.

2. The method of manufacturing a semiconductor device according to claim 1, wherein the step of forming the recessed parts includes the step of isotropically etching the substrate.

3. The method of manufacturing a semiconductor device according to claim 1, wherein the step of depositing a semiconductor layer on the insulating film to fill the recessed parts comprises the steps of:

forming the semiconductor layer on an entire surface of the substrate; and etching back the semiconductor layer to an upper surface of the semiconductor substrate.

4. The method of manufacturing a semiconductor device according to claim 1, wherein the semiconductor layer on the insulating film to fill the recessed parts comprises a polysilicon film.

5. The method of manufacturing a semiconductor device as claimed in claim 4, wherein the step of depositing a semiconductor layer on the insulating film to fill the recessed parts comprises the steps of:

forming an undoped polysilicon film; and ion-implanting impurities into the undoped polysilicon film, thereby forming a doped polysilicon film.

6. The method of manufacturing a semiconductor device according claim 1, wherein the step of forming the impurity regions comprises the step of doping the semiconductor substrate beneath the gate with impurities of the semiconductor layer.

7. The method of manufacturing a semiconductor device according to claim 6, wherein the insulating film serves as a diffusion-blocking film when the impurity regions are formed.

8. The method of manufacturing a semiconductor device according claim 1, wherein the step of forming the impurity regions comprises the step of automatically doping the semiconductor substrate beneath the gate with impurities of the semiconductor layer through a heat treatment process.

9. The method of manufacturing a semiconductor device according to claim 8, wherein the insulating film serves as a diffusion-blocking film when the impurity regions are formed.

10. The method of manufacturing a semiconductor device according to claim 1, wherein the step of providing an insulating film on the recessed parts underneath the spacer comprises the steps of:

forming a nitride film on an entire surface of the substrate including the recessed parts;

anisotropically etching the nitride film, the nitride film remaining only on the recessed parts underneath the spacer;

forming the insulating film on a bottom of the recessed parts where the nitride film is removed; and removing the remaining nitride film.

11. The method of manufacturing a semiconductor device according to claim 1, wherein the insulating film is an oxide film.

12. The method of manufacturing a semiconductor device according to claim 1, wherein the step of forming the spacer includes the step of forming a sidewall spacer.

13. The method of manufacturing a semiconductor device according to claim 1, wherein the step of forming the insulating film includes the step of forming the insulating film only on bottom portions of the recessed parts of the substrate.

14. The method of manufacturing a semiconductor device according to claim 1, wherein the semiconductor layer on the insulating film to fill the recessed parts comprises a directly doped polysilicon film.

* * * * *